(12) United States Patent
Tagami (10) Patent No.: US 10,811,360 B2
(45) Date of Patent: Oct. 20, 2020

(54) SEMICONDUCTOR DEVICE, METHOD FOR MANUFACTURING SEMICONDUCTOR DEVICE AND ALIGNMENT MARK

(71) Applicant: TOSHIBA MEMORY CORPORATION, Minato-ku (JP)

(72) Inventor: Masayoshi Tagami, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 474 days.

(21) Appl. No.: 15/061,579

(22) Filed: Mar. 4, 2016

(65) Prior Publication Data

US 2017/0062350 A1   Mar. 2, 2017

Related U.S. Application Data

(60) Provisional application No. 62/212,732, filed on Sep. 1, 2015.

(51) Int. Cl.
*H01L 23/544* (2006.01)
*H01L 23/522* (2006.01)
(Continued)

(52) U.S. Cl.
CPC ...... *H01L 23/544* (2013.01); *H01L 21/76877* (2013.01); *H01L 23/528* (2013.01);
(Continued)

(58) Field of Classification Search
CPC ......... H01L 23/544; H01L 2223/54426; H01L 21/76802–76805; H01L 21/76877–76883; H01L 23/522; H01L 23/5226; H01L 23/528; H01L 23/5283; H01L 23/535; H01L 23/48; H01L 23/481; H01L 21/76895; H01L 2224/26135;
(Continued)

(56) References Cited

U.S. PATENT DOCUMENTS

| 5,739,579 A | * | 4/1998 | Chiang | ............. H01L 21/76801 257/635 |
| 6,677,682 B1 | * | 1/2004 | Fujiki | ............... H01L 21/76819 257/797 |

(Continued)

FOREIGN PATENT DOCUMENTS

| JP | 2001-44105 | 2/2001 |
| JP | 2003-209037 | 7/2003 |
| JP | 2007-214399 | 8/2007 |

*Primary Examiner* — Monica D Harrison
*Assistant Examiner* — John Lin
(74) *Attorney, Agent, or Firm* — Oblon, McClelland, Maier & Neustadt, L.L.P.

(57) ABSTRACT

According to one embodiment, a semiconductor device includes a semiconductor layer, an insulating film, a first interconnect, a conductor, and a frame-shaped portion. The insulating film is provided on the semiconductor layer. The first interconnect is provided on the insulating film. The conductor extends through the insulating film and electrically connects the semiconductor layer and the first interconnect. The frame-shaped portion extends through the insulating film and is provided in a second region different from a first region, the conductor being provided in the first region. The frame-shaped portion protrudes from a surface of the insulating film on which the first interconnect is provided.

9 Claims, 10 Drawing Sheets (51) Int. Cl.
*H01L 23/528* (2006.01)
*H01L 23/532* (2006.01)
*H01L 21/768* (2006.01)

(52) U.S. Cl.
CPC ...... *H01L 23/5226* (2013.01); *H01L 23/5329* (2013.01); *H01L 2223/5442* (2013.01); *H01L 2223/5446* (2013.01); *H01L 2223/54426* (2013.01)

(58) Field of Classification Search
CPC ... H01L 2224/26165; H01L 2224/2499; H01L 2224/24991
See application file for complete search history.

(56) References Cited

U.S. PATENT DOCUMENTS

| | | | | |
|---|---|---|---|---|
| 2006/0027926 | A1* | 2/2006 | Kirikoshi | H01L 23/522 257/758 |
| 2007/0090548 | A1* | 4/2007 | Chia | G03F 9/7076 257/797 |
| 2013/0330904 | A1* | 12/2013 | Yao | G03F 7/70633 438/401 |

* cited by examiner

SEMICONDUCTOR DEVICE, METHOD FOR MANUFACTURING SEMICONDUCTOR DEVICE AND ALIGNMENT MARK

CROSS-REFERENCE TO RELATED APPLICATIONS

This application is based upon and claims the benefit of priority from U.S. Provisional Patent Application 62/212,732, filed on Sep. 1, 2015; the entire contents of which are incorporated herein by reference.

FIELD

Embodiments described herein relate generally to a semiconductor device, a method for manufacturing the semiconductor device, and an alignment mark.

BACKGROUND

As the integration of a semiconductor device becomes high, the interconnect spacing in the interior of the semiconductor device becomes narrow; and there is a risk that a leakage current may occur between the interconnects. For example, NAND flash memory has a multilayer interconnect structure in which an upper layer interconnect and a lower layer interconnect are connected to each other inside the memory cell. Therefore, when connecting the upper layer interconnect to the lower layer interconnect by pattern formation by exposure processing using a mask, it is favorable to reduce the positional shift between the interconnects by using an alignment mark. However, it is difficult to form an alignment mark having high detection precision in such a stacked semiconductor device.

DETAILED DESCRIPTION

According to one embodiment, a semiconductor device includes a semiconductor layer, an insulating film, a first interconnect, a conductor, and a frame-shaped portion. The insulating film is provided on the semiconductor layer. The first interconnect is provided on the insulating film. The conductor extends through the insulating film and electrically connects the semiconductor layer and the first interconnect. The frame-shaped portion extends through the insulating film and is provided in a second region different from a first region, the conductor being provided in the first region. The frame-shaped portion protrudes from a surface of the insulating film on which the first interconnect is provided.

Embodiments will now be described with reference to the drawings. The same components in the drawings are marked with the same reference numerals.

The semiconductor device of the embodiment is a semiconductor memory device.

EMBODIMENT

Figure 1A:
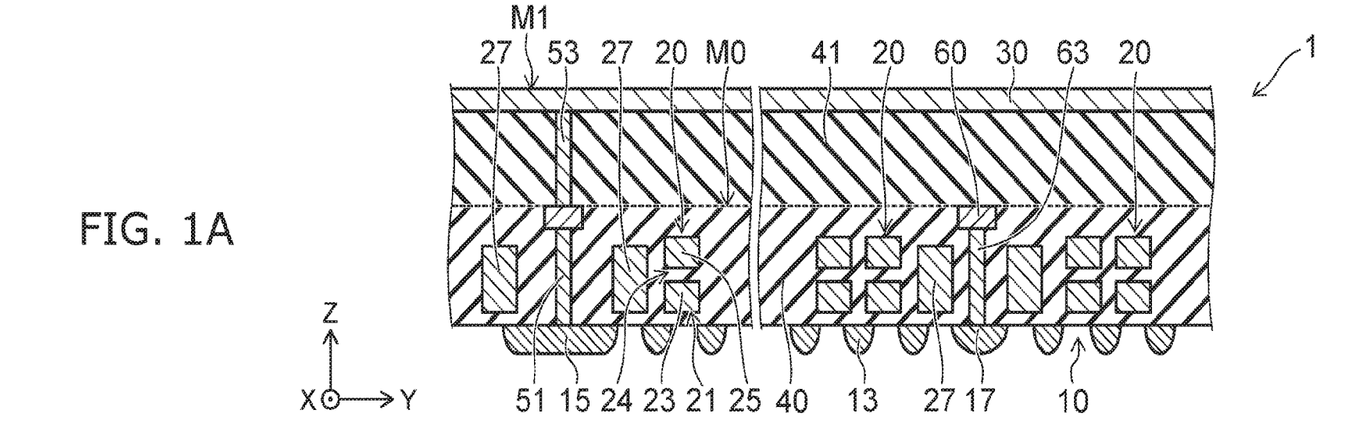
FIG. 1A and FIG. 1B are schematic cross-sectional views showing the semiconductor device of the embodiment.
Figure 1B:
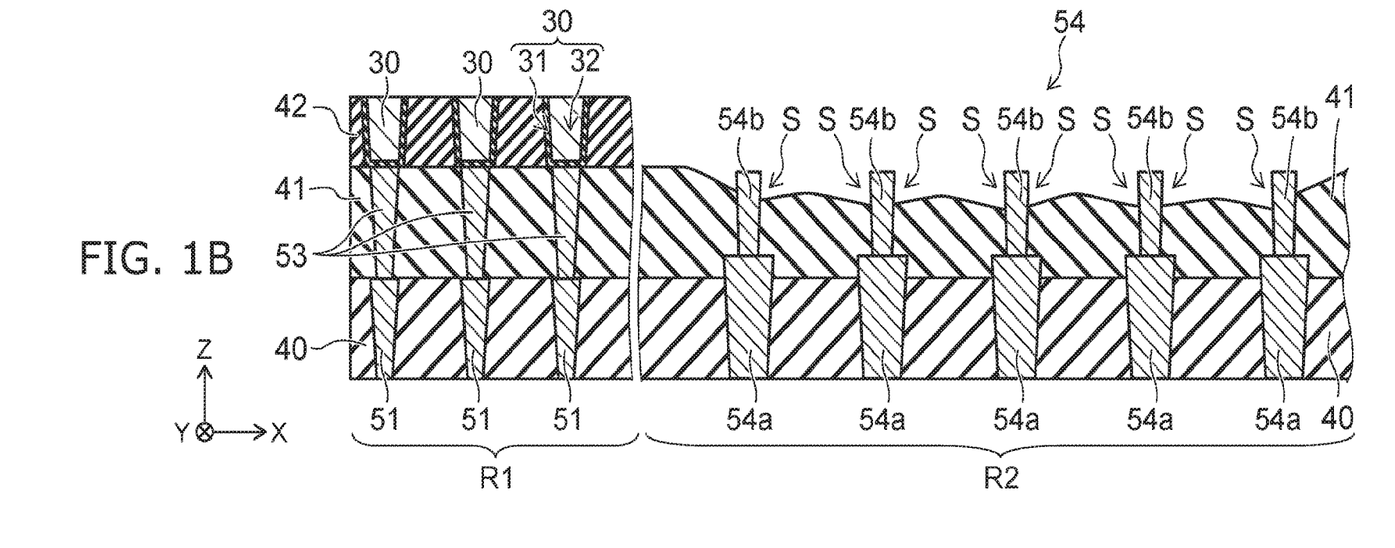

FIG. 1A and FIG. 1B are schematic cross-sectional views showing the semiconductor device of the embodiment.

FIG. 1A is a schematic view showing the Y-Z cross section of the semiconductor device 1. FIG. 1B is a schematic view showing the X-Z cross section of the semiconductor device 1. FIG. 1B shows portions of layers higher than a semiconductor layer 10.

Two mutually-orthogonal directions parallel to the front surface of the semiconductor layer 10 are taken as an X-direction and a Y-direction; and a direction orthogonal to both the X-direction and the Y-direction is taken as a Z-direction (a stacking direction).

As shown in FIG. 1A, the semiconductor device 1 includes the semiconductor layer 10, multiple memory cells 20 that are provided on the semiconductor layer 10, and selection gates 27. The multiple memory cells 20 are arranged on the semiconductor layer 10; and the selection gates 27 are provided on two sides of the multiple memory cells 20. Each of the memory cells 20 includes a floating gate 23 that is provided, with a tunneling insulating film 21 interposed, on the semiconductor layer 10, and a control gate 25 that is provided, with a blocking insulating film 24 interposed, on the floating gate 23.

The semiconductor layer 10 is, for example, a p-type semiconductor and includes source/drain regions 13, a drain region 15, and a source region 17 that are n-type regions provided in the front surface of the semiconductor layer 10. The source/drain regions 13 are provided between adjacent memory cells 20 and between the memory cell 20 and the selection gate 27.

Thus, the semiconductor device 1 includes a NAND string that includes the multiple memory cells 20 and the selection gates 27 disposed on the semiconductor layer 10. Multiple bit lines 30 are disposed, with an inter-layer insulating film 40 (a first insulating film) and an inter-layer insulating film 41 (a second insulating film) interposed, above the NAND string. The bit lines 30 extend in the Y-direction.

In the example shown in FIG. 1A, the inter-layer insulating film 40 is provided between the semiconductor layer 10 and the inter-layer insulating film 41. An interconnect layer M0 is formed inside the inter-layer insulating film 40 and includes, for example, a source line 60 and gate lines (not shown). An interconnect layer M1 is provided on the inter-layer insulating film 41 and includes the multiple bit lines 30.

The bit lines 30 are electrically connected to the semiconductor layer 10 via contact plugs 51 and 53. The contact plugs 51 and 53 are metal layers and are, for example, tungsten layers. The contact plugs 51 and 53 are conductors.

The contact plug 51 extends in the Z-direction through the inter-layer insulating film 40; and one end of the contact plug 51 contacts the drain region 15 provided in the semiconductor layer 10. Thereby, the contact plug 51 is electrically connected to one end of the NAND string. The selection gate 27 is disposed between the contact plug 51 and the multiple memory cells 20.

The contact plug 53 extends in the Z-direction through the inter-layer insulating film 41; and one end of the contact plug 53 is electrically connected to the bit line 30. The other end of the contact plug 53 is electrically connected to the contact plug 51.

The source line 60 is electrically connected to the other end of the NAND string via a contact plug 63. The source line 60 is included in the interconnect layer M0 and extends in the X-direction through the inter-layer insulating film 40. One end of the contact plug 63 contacts the source region 17; and the other end of the contact plug 63 contacts the source line 60. Another selection gate 27 is disposed between the contact plug 63 and the multiple memory cells 20.

The bit line 30 extends in the Y-direction. The bit line 30 includes, for example, a barrier layer 31 and a conductive layer 32. The barrier layer 31 is, for example, a titanium nitride layer and contacts the contact plug 53. The conductive layer 32, for example, a metal layer including copper (Cu) and is provided on the barrier layer 31. The barrier layer 31 suppresses the diffusion of metal atoms from the conductive layer 32 into the inter-layer insulating film 41. For example, the bit line 30 is formed inside an inter-layer insulating film 42.

As shown in FIG. 1B, the semiconductor device 1 includes a first region R1 and a second region R2. The contact plugs 51 and 53 are provided in the first region R1. In the first region R1, one end of the contact plug 51 contacts the drain region 15 provided in the semiconductor layer 10; and one end of the contact plug 53 is electrically connected to the bit line 30. The bit lines 30 are arranged in the X-direction respectively on the contact plugs 53. The first region R1 is an interconnect region.

An alignment mark 54 is provided in the second region R2. The alignment mark 54 includes a first portion 54a and a second portion 54b. For example, the alignment mark 54 is a dummy interconnect portion; and the second region R2 is a dummy interconnect region. The second region R2 may be a region that includes a dicing line. In such a case, the second region R2 is cut along the dicing line.

A step S is provided between the second portion 54b and the inter-layer insulating film 41; and a recessed portion is formed from the second portion 54b and the inter-layer insulating film 41.

For example, the first portion 54a and the second portion 54b are formed when forming the contact plugs 51 and 53. The first portion 54a and the second portion 54b are metal layers, e.g., tungsten layers. In such a case, the alignment mark 54 is conductive. The first portion 54a and the second portion 54b may be formed separately from the formation of the contact plugs 51 and 53.

For example, the first portion 54a and the second portion 54b may be formed of a semiconductor layer including polysilicon, etc. Also, the first portion 54a and the second portion 54b may be formed using different materials. The first portion 54a and the second portion 54b can be formed using any material for which the step S occurs between the second portion 54b and the inter-layer insulating film 41.

The configuration of the alignment mark 54 will now be described.

Figure 2:
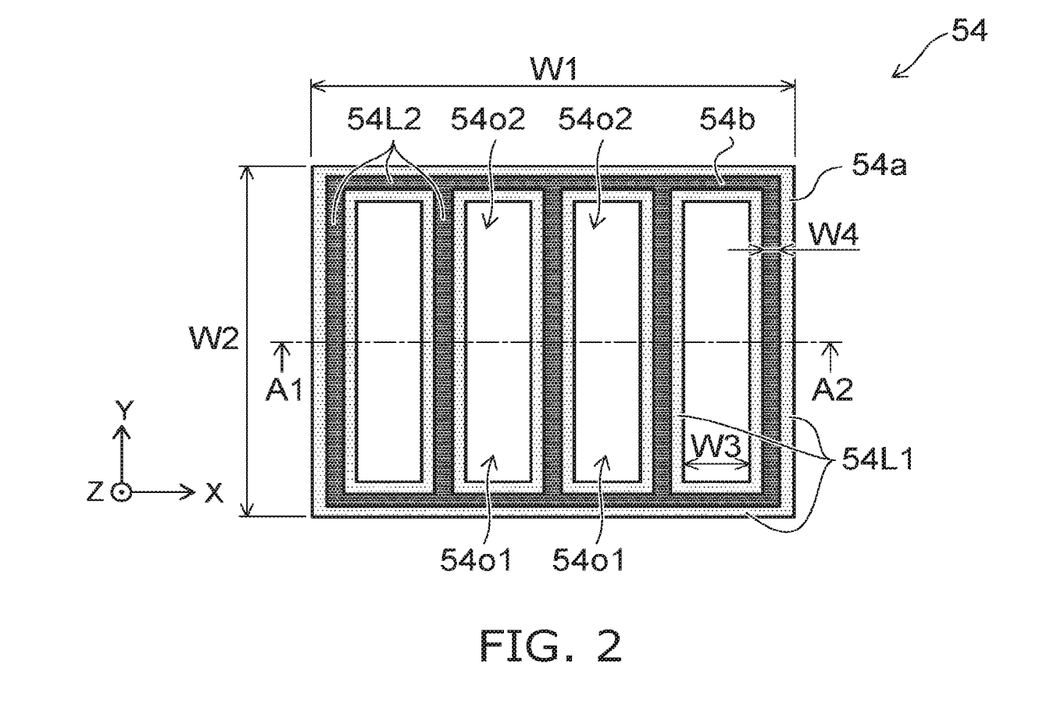
FIG. 2 is a schematic top view of a portion of the semiconductor device of the embodiment.
Figure 3:
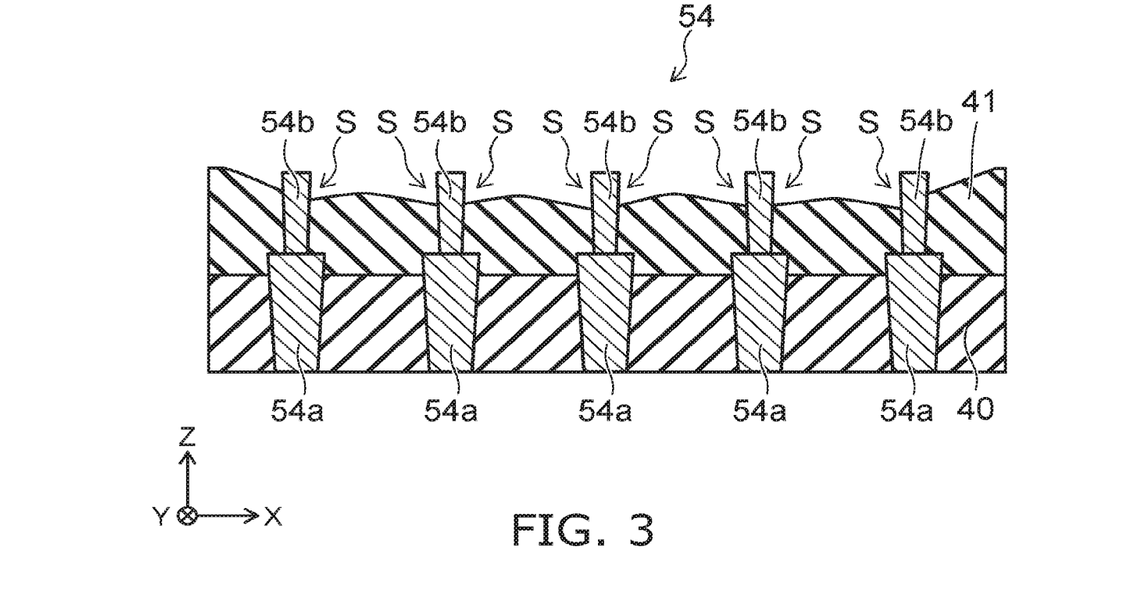
FIG. 3 is an enlarged cross-sectional view of line A1-A2 of FIG. 2.

FIG. 2 is a schematic top view of a portion of the semiconductor device of the embodiment. FIG. 3 is an enlarged cross-sectional view of line A1-A2 of FIG. 2.

The first portion 54a and the second portion 54b of the alignment mark 54 when the semiconductor device 1 is viewed from the upper surface are shown in FIG. 2. FIG. 3 shows the first portion 54a that is formed inside the inter-layer insulating film 40, and the second portion 54b that is formed inside the inter-layer insulating film 41.

As shown in FIG. 2, the first portion 54a includes multiple line-shaped portions 54L1. The first portion 54a has an opening 54o1 that is a region surrounded with the multiple line-shaped portions 54L1. The line-shaped portions are portions having substantially straight line configurations. The first portion 54a may include a bent portion or a curved portion in at least a portion of the first portion 54a.

The first portion 54a has, for example, a frame-like configuration, a lattice configuration, or a configuration in which a frame-like configuration and a lattice configuration are combined. In the example shown in FIG. 2, the first portion 54a has a configuration in which four frame-shaped portions are linked to be continuous in the X-direction; and four openings 54o1 are provided in the first portion 54a.

For example, a width W1 in the X-direction of the first portion 54a is 12 micrometers or less; and a width W2 in the Y-direction of the first portion 54a is 3.25 micrometers or less. A width W3 of the opening 54o1 is 1.5 micrometers or less.

The second portion 54b is connected to the first portion 54a and includes multiple line-shaped portions 54L2. The second portion 54b has an opening 54o2 that is a region surrounded with the multiple line-shaped portions 54L2. The second portion 54b may include a bent portion or a curved portion in at least a portion of the second portion 54b.

For example, the second portion 54b has a frame-like configuration, a lattice configuration, or a configuration in which a frame-like configuration and a lattice configuration are combined. In the example shown in FIG. 2, the second portion 54b has a configuration in which four frame-shaped portions are linked to be continuous in the X-direction; and four openings 54o2 are provided in the second portion 54b. For example, a width W4 of the second portion 54b is 220 nanometers or less.

As shown in FIG. 3, the inter-layer insulating films 40 and 41 are disposed respectively in the openings 54o1 and 54o2. The step S is provided between the second portion 54b and the inter-layer insulating film 41; and a recessed portion is formed from the second portion 54b and the inter-layer insulating film 41.

The alignment mark 54 is an alignment mark for forming the bit lines 30 connected to the contact plugs 53. For example, when forming the bit lines 30 by pattern formation by exposure processing using a mask, the alignment mark 54 is detected by optically detecting the step S via the metal layer, etc., provided on the inter-layer insulating film 41. Subsequently, alignment of the mask pattern is performed based on the alignment mark 54; and the bit lines 30 and the contact plugs 53 are electrically connected by patterning the metal layer.

As described above, the first portion 54a and the second portion 54b have configurations in which multiple frame-shaped portions are linked to be continuous in the X-direction. A region (the opening 54o2) that is surrounded with the configuration of the second portion 54b occurs. Thereby, the step S can be caused to occur between the second portion 54b and the inter-layer insulating film 41 disposed in the opening 54o2.

For example, in the case where a positional shift occurs when aligning the bit lines 30 and the contact plugs 53, a portion of the contact plug 53 appears directly under the space between the adjacent bit lines 30. Then, in the case where the memory cells 20 are disposed at a high density and the spacing of the adjacent bit lines 30 becomes narrow, the spacing between the contact plug 53 and the bit line 30 also becomes narrow. Therefore, an increase of the leakage current between the adjacent bit lines 30 and a decrease of the insulation breakdown voltage between the bit lines 30 occur; and there is a risk that the manufacturing yield of the semiconductor device 1 may decrease.

Therefore, in the embodiment, the positional shift when electrically connecting the bit lines 30 to the contact plugs 53 is suppressed by providing the step S between the alignment mark 54 (the second portion 54b) and the inter-layer insulating film 41. Thereby, the leakage current between the adjacent bit lines 30 is suppressed; and the insulation breakdown voltage can be increased.

A modification of the configuration of the alignment mark 54 will now be described.

Figure 4:
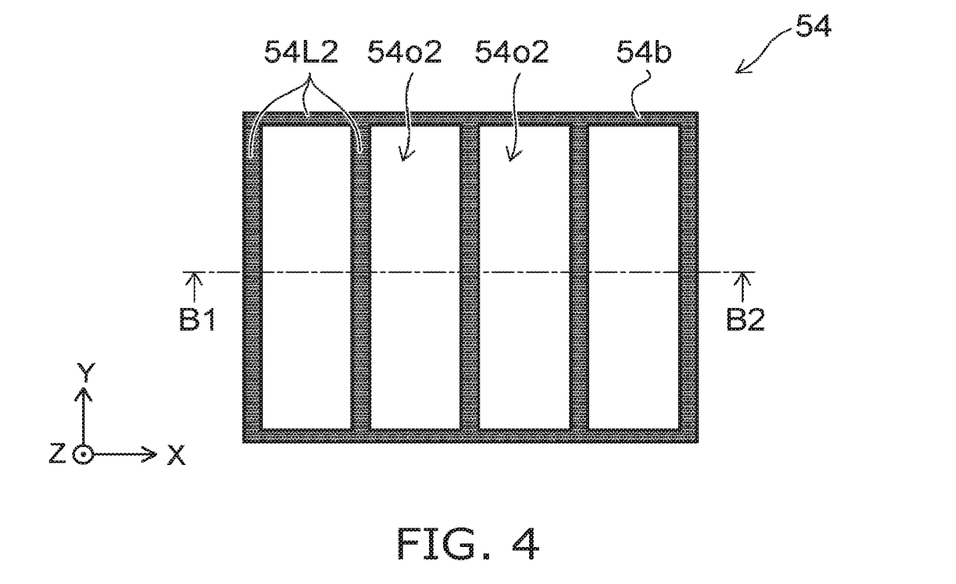
FIG. 4 is a schematic top view of a portion of a semiconductor device according to the modification of the embodiment.
Figure 5:
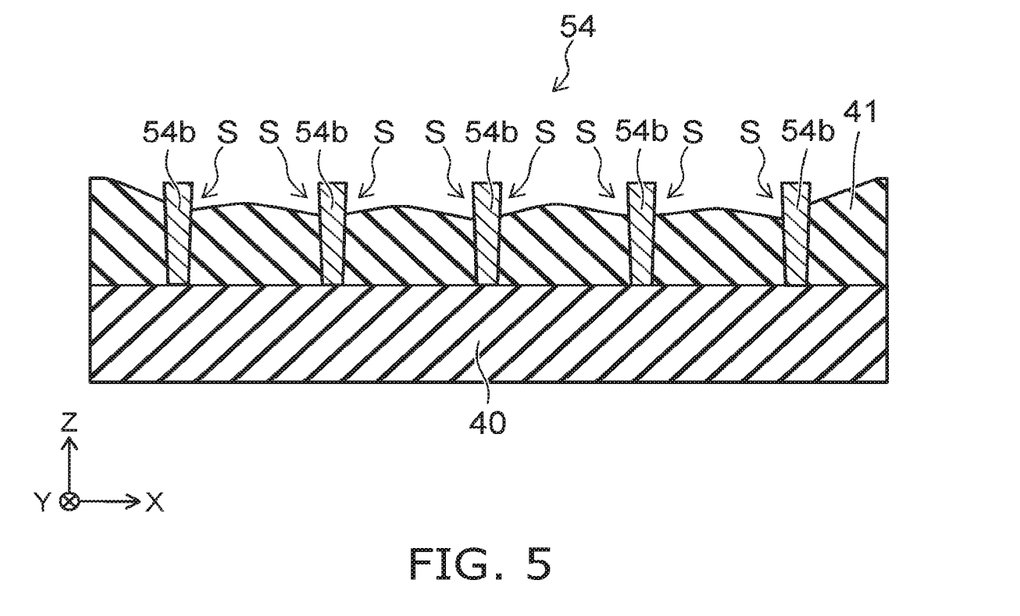
FIG. 5 is an enlarged cross-sectional view of line B1-B2 of FIG. 4.

FIG. 4 is a schematic top view of a portion of a semiconductor device according to the modification of the embodiment. FIG. 5 is an enlarged cross-sectional view of line B1-B2 of FIG. 4.

The second portion 54b of the alignment mark 54 when the semiconductor device 1 is viewed from the upper surface is shown in FIG. 4. FIG. 5 shows the inter-layer insulating films 40 and 41 and the second portion 54b that is formed inside the inter-layer insulating film 41. The first portion 54a is not provided in the alignment mark 54 of the modification.

As shown in FIG. 4, the second portion 54b has the opening 54o2 which is a region surrounded with the multiple line-shaped portions 54L2. In the example shown in FIG. 4, the second portion 54b has a configuration in which four frame-shaped portions are linked to be continuous in the X-direction; and four openings 54o2 are provided in the second portion 54b.

As shown in FIG. 5, the inter-layer insulating film 41 is disposed in the opening 54o2. The step S is provided between the second portion 54b and the inter-layer insulating film 41; and a recessed portion is formed from the second portion 54b and the inter-layer insulating film 41.

As described above, the second portion 54b has a configuration in which multiple frame-shaped portions are linked to be continuous in the X-direction. A region (the opening 54o2) that is surrounded with the configuration of the second portion 54b occurs. Thereby, the step S can be caused to occur between the second portion 54b and the inter-layer insulating film 41 disposed in the opening 54o2.

Another modification of the configuration of the alignment mark 54 will now be described.

Figure 6:
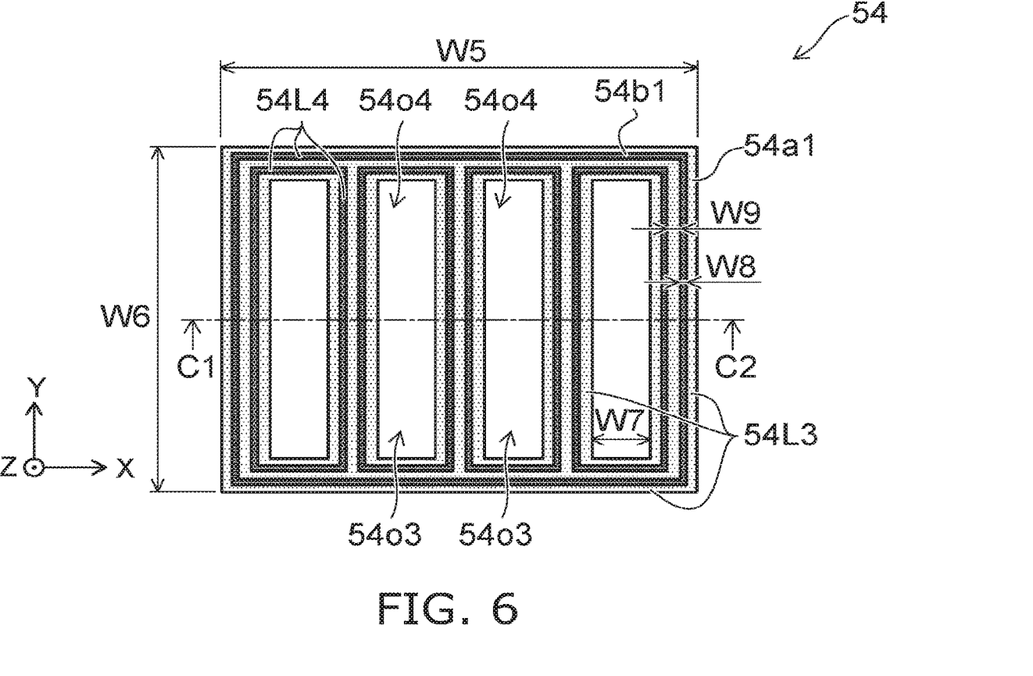
FIG. 6 is a schematic top view of a portion of the semiconductor device according to the other modification of the embodiment.
Figure 7:
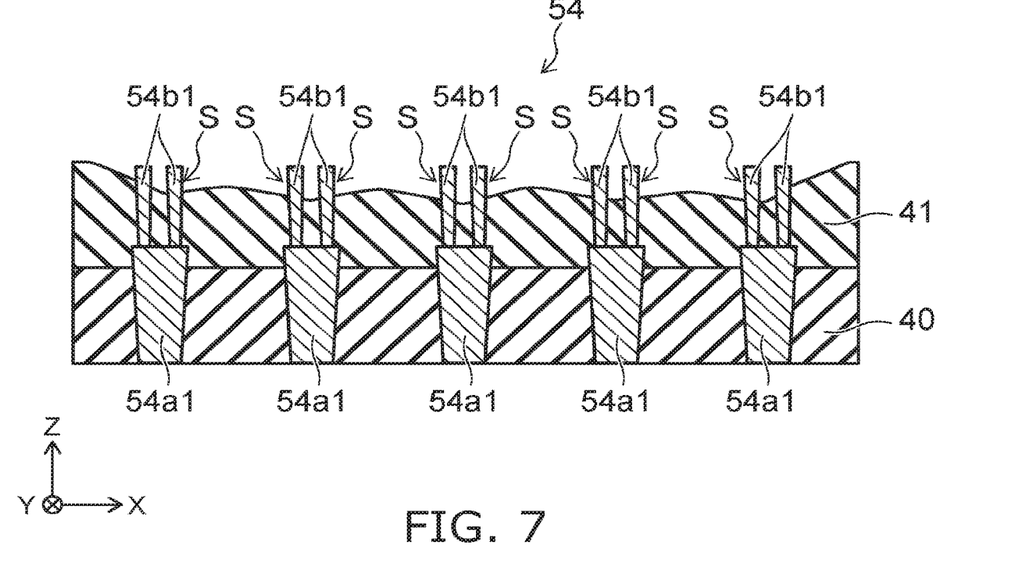
FIG. 7 is an enlarged cross-sectional view of line C1-C2 of FIG. 6.

FIG. 6 is a schematic top view of a portion of the semiconductor device according to the other modification of the embodiment. FIG. 7 is an enlarged cross-sectional view of line C1-C2 of FIG. 6.

A first portion 54a1 and a second portion 54b1 of the alignment mark 54 when the semiconductor device 1 is viewed from the upper surface are shown in FIG. 6. FIG. 7 shows the first portion 54a1 that is formed inside the inter-layer insulating film 40, and the second portion 54b1 that is formed inside the inter-layer insulating film 41.

As shown in FIG. 6, the first portion 54a1 includes multiple line-shaped portions 54L3. The first portion 54a1 has an opening 54o3 that is a region surrounded with the multiple line-shaped portions 54L3. In the example shown in FIG. 6, the first portion 54a1 has a configuration in which four frame-shaped portions are linked to be continuous in the X-direction; and four openings 54o3 are provided in the first portion 54a1.

For example, a width W5 in the X-direction of the first portion 54a1 is 12 micrometers or less; and a width W6 in the Y-direction of the first portion 54a1 is 3.25 micrometers or less. A width W7 of the opening 54o3 is 1.5 micrometers or less.

The second portion 54b1 is connected to the first portion 54a1 and includes multiple line-shaped portions 54L4. The second portion 54b1 has an opening 54o4 that is a region surrounded with the multiple line-shaped portions 54L4. In the example shown in FIG. 6, two line-shaped portions 54L4 are disposed along the line-shaped portions 54L3 of the first portion 54a1. Also, the second portion 54b1 has a configuration in which four frame-shaped portions (second frame-shaped portions) are linked to be continuous in the X-direction inside one frame-shaped portion (a first frame-shaped portion); and four openings 54o4 are provided in the four frame-shaped portions. Three or more line-shaped portions 54L4 may be disposed along the line-shaped portions 54L3 of the first portion 54a1.

For example, a width W8 of the line-shaped portion 54L4 is 220 nanometers or less. A width W9 of the gap between the adjacent line-shaped portions 54L4 is 200 nanometers or less.

As shown in FIG. 7, the inter-layer insulating films 40 and 41 are disposed respectively in the openings 54o3 and 54o4. The step S is provided between the second portion 54b1 and the inter-layer insulating film 41; and a recessed portion is formed from the second portion 54b1 and the inter-layer insulating film 41.

As described above, the first portion 54a1 and the second portion 54b1 have configurations in which multiple frame-shaped portions are linked to be continuous in the X-direction. A region (the opening 54o4) that is surrounded with the configuration of the second portion 54b1 occurs. Thereby, the step S can be caused to occur between the second portion 54b1 and the inter-layer insulating film 41 disposed in the opening 54o4.

Another modification of the configuration of the alignment mark 54 will now be described.

Figure 8:
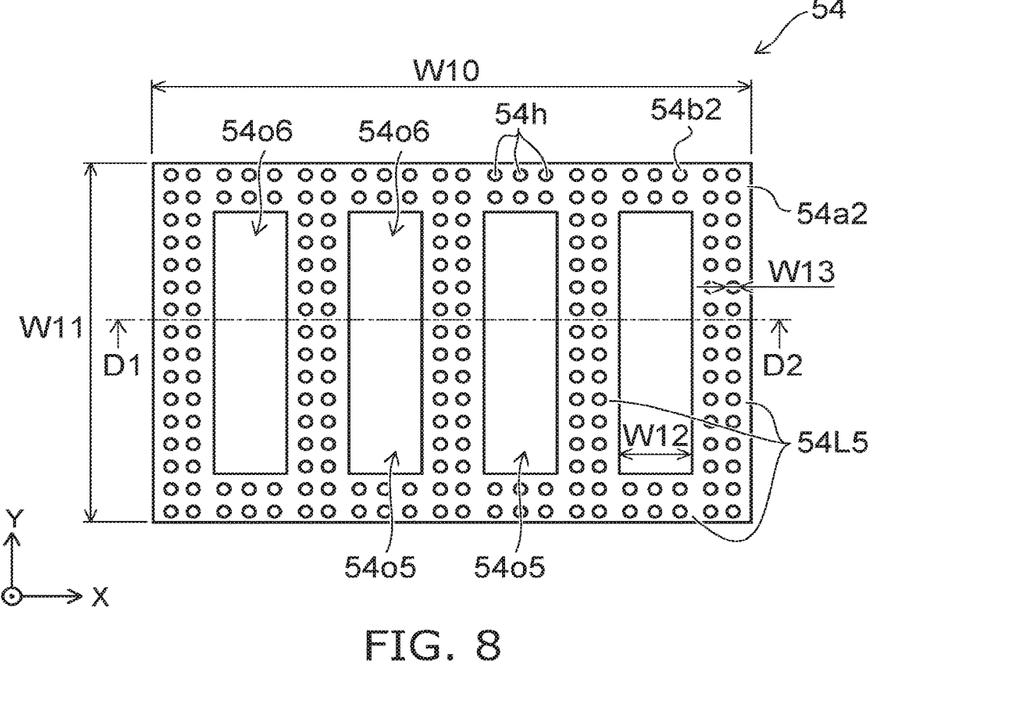
FIG. 8 is a schematic top view of a portion of the semiconductor device according to the other modification of the embodiment.
Figure 9:
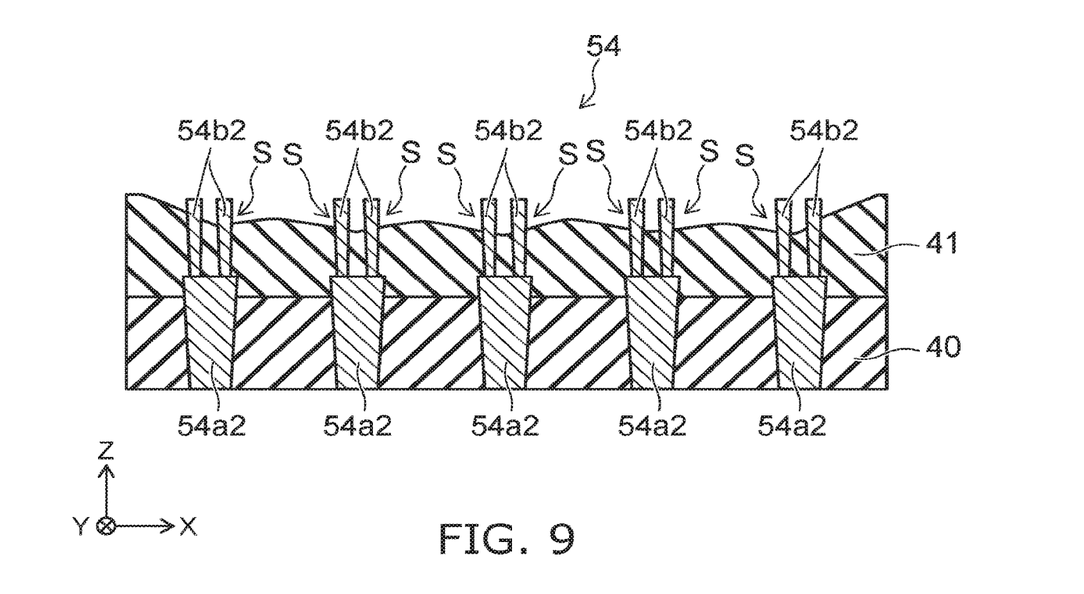
FIG. 9 is an enlarged cross-sectional view of line D1-D2 of FIG. 8.

FIG. 8 is a schematic top view of a portion of the semiconductor device according to the other modification of the embodiment. FIG. 9 is an enlarged cross-sectional view of line D1-D2 of FIG. 8.

A first portion 54a2 and a second portion 54b2 of the alignment mark 54 when the semiconductor device 1 is viewed from the upper surface are shown in FIG. 8. FIG. 9 shows the first portion 54a2 that is formed inside the inter-layer insulating film 40, and the second portion 54b2 that is formed inside the inter-layer insulating film 41.

As shown in FIG. 8, the first portion 54a2 includes multiple line-shaped portions 54L5. The first portion 54a2 has an opening 54o5 that is a region surrounded with the multiple line-shaped portions 54L5. In the example shown in FIG. 8, the first portion 54a2 has a configuration in which four frame-shaped portions are linked to be continuous in the X-direction; and four openings 54o5 are provided in the first portion 54a2.

For example, a width W10 in the X-direction of the first portion 54a2 is 12 micrometers or less; and a width W11 in the Y-direction of the first portion 54a2 is 3.25 micrometers or less. A width W12 of the opening 54o5 is 1.5 micrometers or less.

The second portion 54b2 is connected to the first portion 54a2 and includes multiple columnar portions 54h. The columnar portions 54h are, for example, portions provided in circular columnar configurations. The second portion 54b2 has an opening 54o6 that is a region surrounded with the multiple columnar portions 54h. That is, the multiple columnar portions 54h are disposed in a frame-like configuration to make the opening 54o6. In the example shown in FIG. 8, the multiple columnar portions 54h are disposed in two columns along the line-shaped portions 54L5 of the first portion 54a2. Also, four openings 54o6 are provided in the second portion 54b2. The multiple columnar portions 54h may be disposed in three or more columns along the line-shaped portions 54L5 of the first portion 54a2.

For example, a width W13 of the columnar portion 54h is 150 nanometers or less.

As shown in FIG. 9, the inter-layer insulating films 40 and 41 are disposed respectively in the openings 54o5 and 54o6. The step S is provided between the second portion 54b2 and the inter-layer insulating film 41; and a recessed portion is formed from the second portion 54b2 and the inter-layer insulating film 41.

As described above, the first portion 54a2 has a configuration in which multiple frame-shaped portions are linked to be continuous in the X-direction. The second portion 54b2 includes the multiple columnar portions 54h disposed in a frame-like configuration along the first portion 54a2. A region (the opening 54o6) that is surrounded with the configuration of the second portion 54b2 occurs. Thereby, the step S can be caused to occur between the second portion 54b2 and the inter-layer insulating film 41 disposed in the opening 54o6.

The arrangement of the alignment marks 54 will now be described.

Figure 10:
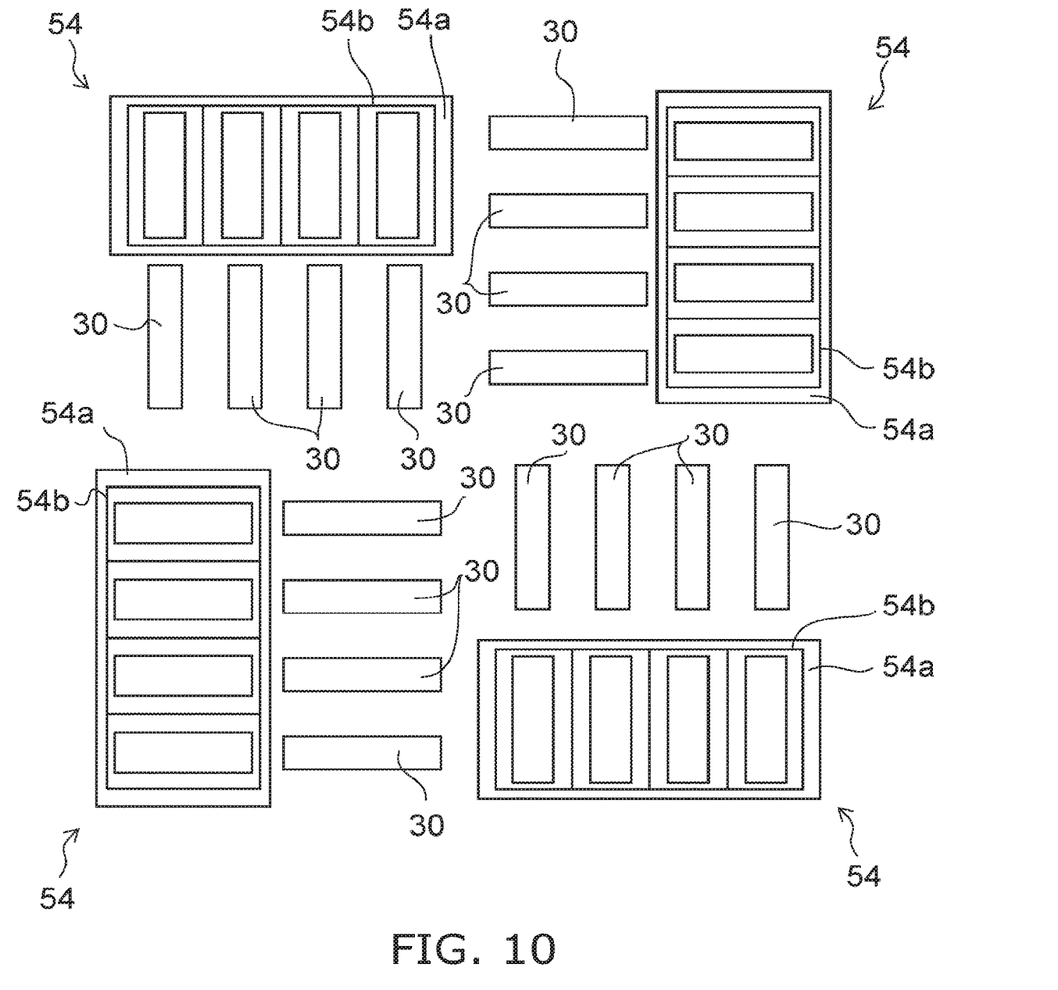
FIG. 10 is a schematic top view of the semiconductor device of the embodiment.
Figure 11:
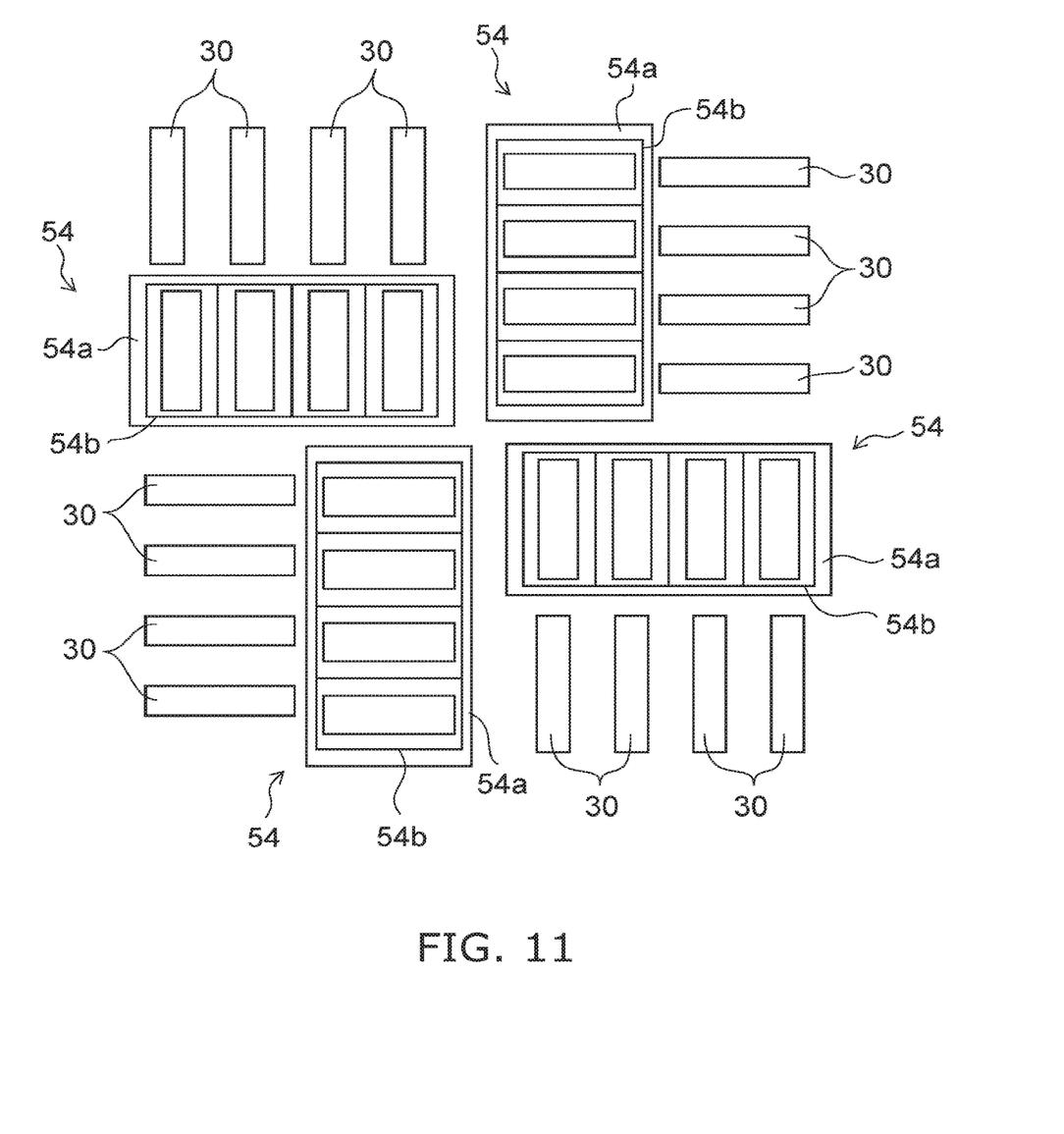
FIG. 11 is a schematic top view of the semiconductor device according to the modification of the embodiment.

FIG. 10 is a schematic top view of the semiconductor device of the embodiment. FIG. 11 is a schematic top view of the semiconductor device according to the modification of the embodiment.

Examples of the arrangement of the alignment marks 54 and the bit lines 30 when the semiconductor device 1 is viewed from the upper surface are shown in FIG. 10 and FIG. 11.

As shown in FIG. 10, the alignment mark 54 that includes the first portion 54a and the second portion 54b is disposed in the second region R2 provided on the outer side of the semiconductor device 1. The bit lines 30 are disposed in the first region R1 provided on the inner side of the semiconductor device 1. By such an arrangement of the alignment marks 54, the multiple bit lines 30 can be provided on the inter-layer insulating film 41 to be electrically connected to the contact plugs 53.

As shown in FIG. 11, the alignment mark 54 that includes the first portion 54a and the second portion 54b is disposed in the second region R2 provided on the inner side of the semiconductor device 1. The bit lines 30 are disposed in the first region R1 provided on the outer side of the semiconductor device 1. By such an arrangement of the alignment marks 54, the multiple bit lines 30 can be provided on the inter-layer insulating film 41 to be electrically connected to the contact plugs 53.

A method for manufacturing the semiconductor device 1 will now be described.

FIG. 12A to FIG. 12F are schematic cross-sectional views showing the method for manufacturing the semiconductor device of the embodiment. FIG. 13 is a figure describing the occurrence of the step.

FIG. 12A to FIG. 12F are schematic cross-sectional views showing processes of forming the alignment mark 54 in the second region R2. FIG. 13 is an enlarged view of FIG. 12E and is a figure describing the state in which the step S occurs between the inter-layer insulating film 41 and the second portion 54b of the alignment mark 54.

Figure 12A:
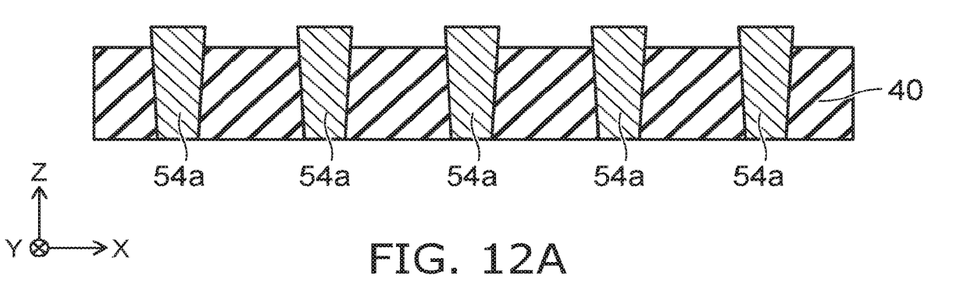
FIG. 12A to FIG. 12F are schematic cross-sectional views showing a method for manufacturing the semiconductor device of the embodiment.
Figure 13:
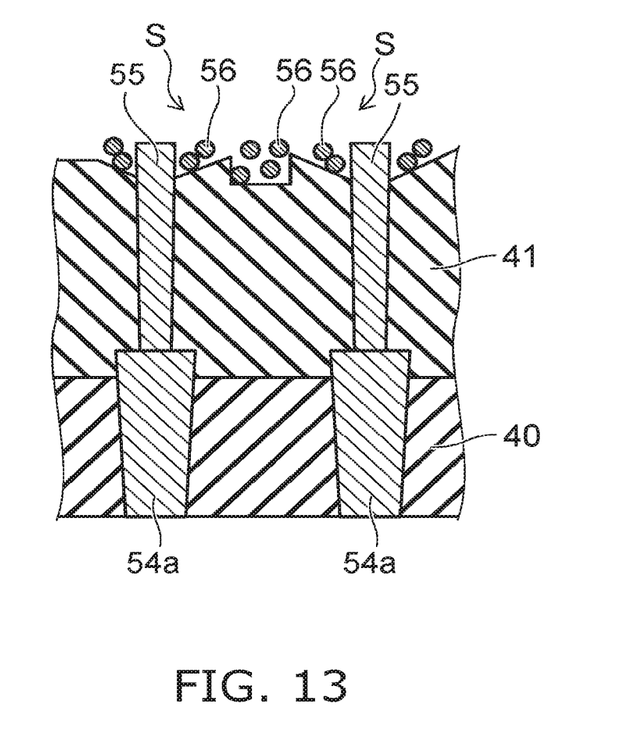
FIG. 13 is a figure describing the occurrence of the step.

As shown in FIG. 12A, the first portion 54a is formed inside the inter-layer insulating film 40.

Specifically, the inter-layer insulating film 40 is formed; and a via hole is made in the inter-layer insulating film 40. The inter-layer insulating film 40 is, for example, a silicon oxide film. The inter-layer insulating film 40 is, for example, a TEOS (Tetraethyl Ortho Silicate) film. For example, the via hole is made in a frame-like configuration.

Then, the interior of the via hole is filled by forming a metal layer, e.g., a tungsten layer, that covers the inter-layer insulating film 40. Continuing, the first portion 54a is formed in the interior of the via hole by using CMP (Chemical Mechanical Polish) to remove the metal layer that is on the inter-layer insulating film 40 so that a portion of the metal layer is exposed from the inter-layer insulating film 40.

The first portion 54a may be formed when forming the contact plugs 51. In such a case, in the first region R1, the inter-layer insulating film 40 is formed to cover the semiconductor layer 10, the memory cells 20, and the selection gates 27. Subsequently, the metal layer is formed inside the contact holes of the inter-layer insulating film 40. Thereby, the contact plugs 51 are formed.

Figure 12B:
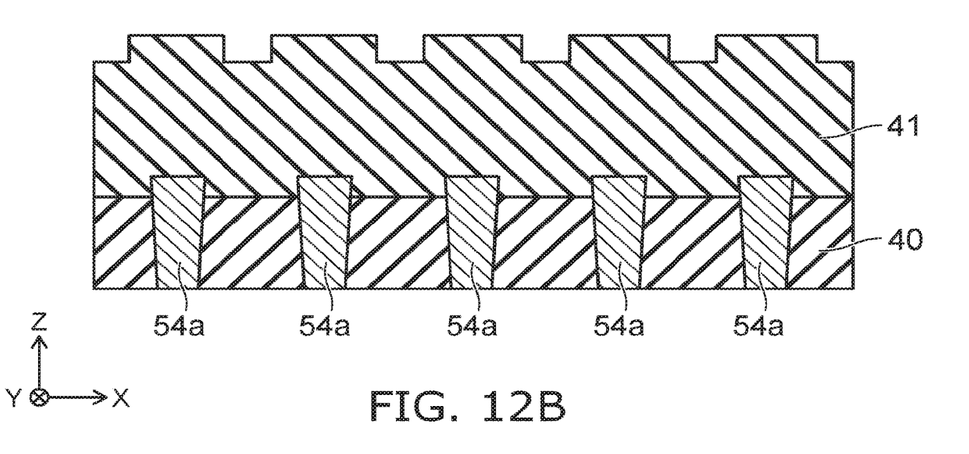

As shown in FIG. 12B, the inter-layer insulating film 41 is formed on the surface of the inter-layer insulating film 40 where the portion of the first portion 54a is exposed. The inter-layer insulating film 41 is, for example, a silicon oxide film. The inter-layer insulating film 41 is, for example, a TEOS film.

Figure 12C:
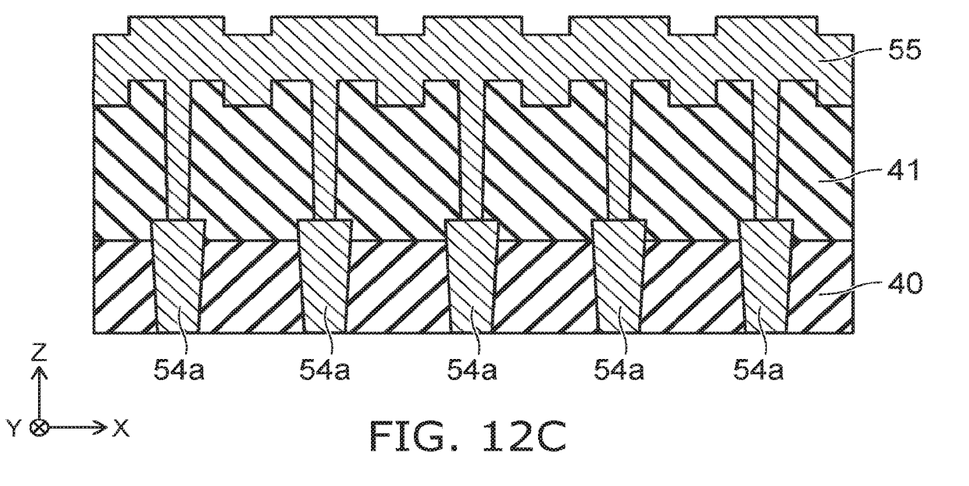

As shown in FIG. 12C, a first layer 55 is formed inside the inter-layer insulating film 41. Specifically, a via hole is made in the inter-layer insulating film 41. For example, the via hole is made in a frame-like configuration. Then, the interior of the via hole is filled by forming the first layer 55, e.g., a tungsten layer, that covers the inter-layer insulating film 41.

Figure 12D:
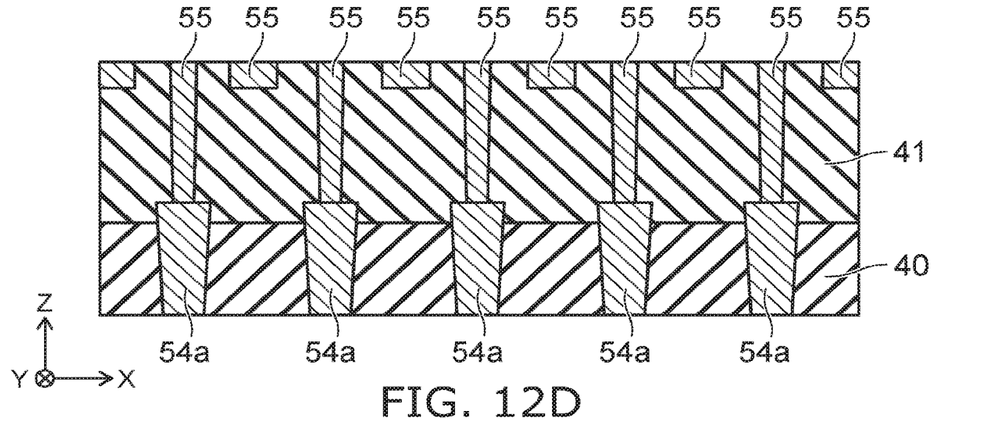

As shown in FIG. 12D, the first layer 55 that is on the inter-layer insulating film 41 is removed using CMP.

Figure 12E:
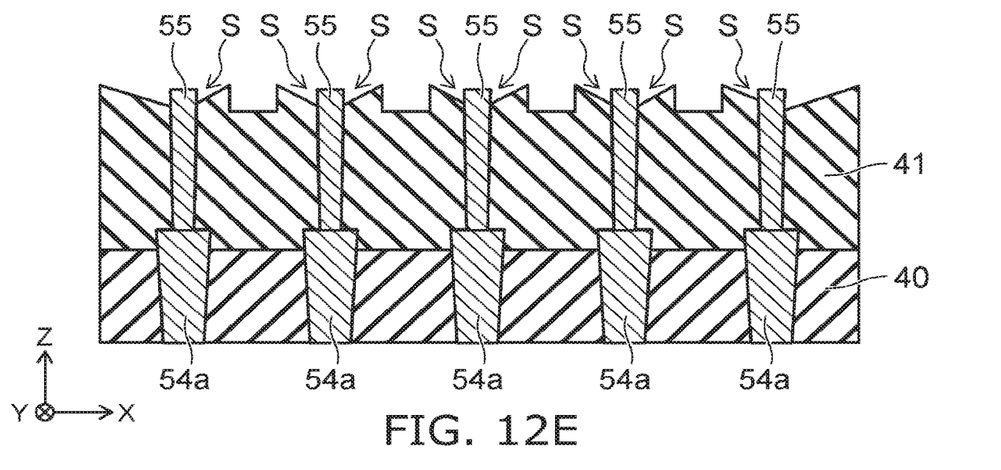

As shown in FIG. 12E, a portion of the inter-layer insulating film 41 and a portion of the first layer 55 are removed using CMP.

When removing the inter-layer insulating film 41 and the first layer 55, the proportion that the inter-layer insulating film 41 is polished and the proportion that the first layer 55 is polished are different. For example, the proportion that the TEOS film is polished is larger than the proportion that the tungsten layer is polished. Thereby, the step S occurs between the first layer 55 and the inter-layer insulating film 41.

As shown in FIG. 13, because a slurry 56 becomes dense easily in the portion where the step S is provided, a phenomenon (a fang) occurs in which the polished proportion becomes high locally. When a fang occurs, the portion where the step S is provided becomes easy to polish.

Also, in the case where the first layer 55 is formed of multiple frame-shaped portions such as those shown in FIG. 2, the density of the slurry 56 inside the frame increases because the slurry 56 becomes dense easily inside the frame. Multiple fangs occur easily inside the frame. Thus, by the multiple fangs occurring, the proportion that the inter-layer insulating film 41 is polished inside the frame becomes high; and a recessed portion is formed from the first layer 55 and the inter-layer insulating film 41.

Figure 12F:
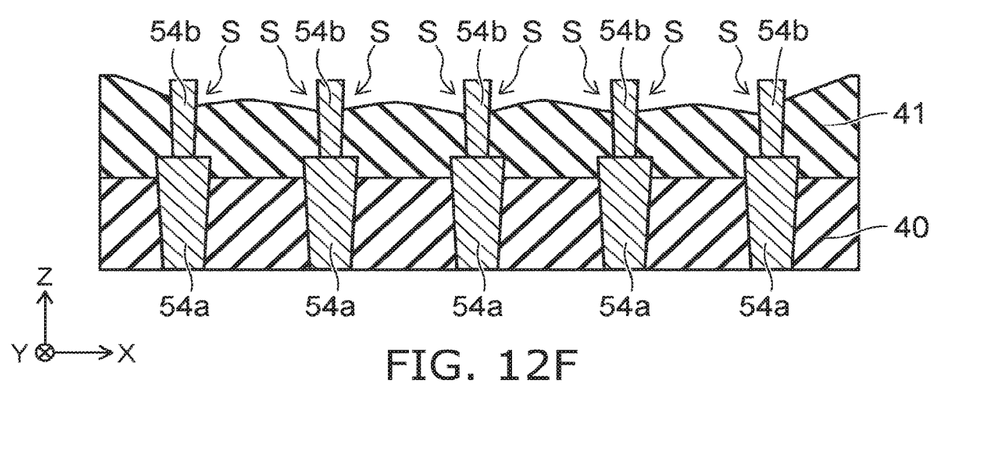

As shown in FIG. 12F, the second portion 54b that has a portion exposed from the inter-layer insulating film 41 is formed. As described above, the step S occurs between the first layer 55 and the inter-layer insulating film 41; the recessed portion is formed from the first layer 55 and the inter-layer insulating film 41; and therefore, a portion of the second portion 54b is exposed from the inter-layer insulating film 41. That is, the step S occurs between the second portion 54b and the inter-layer insulating film 41; and the recessed portion is formed from the second portion 54b and the inter-layer insulating film 41.

The second portion 54b may be formed when forming the contact plugs 53. In such a case, in the first region R1, the inter-layer insulating film 41 is formed on the inter-layer insulating film 40. Subsequently, the first layer 55 is formed inside the contact holes of the inter-layer insulating film 41. Thereby, the contact plugs 53 are formed.

In the second region R2, after the step S is formed between the second portion 54b and the inter-layer insulating film 41, a Cu layer is formed on the inter-layer insulating film 41 and the contact plugs 53 in the first region R1. The exposure apparatus performs the alignment of the mask pattern by detecting the alignment mark 54 by optically detecting the step S. Subsequently, the bit lines 30 are formed by etching the Cu layer using the mask. Thereby, the interconnect pattern of the bit lines 30 is formed.

The bit lines 30 may be formed by forming an insulating layer on the inter-layer insulating film 41 and the contact plugs 53, making interconnect trenches inside the insulating layer by etching using a mask, and subsequently filling a metal layer into the interconnect trenches.

The alignment mark of the embodiment is not limited to a NAND semiconductor memory device and is applicable also to other semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a semiconductor layer;
   an insulating film provided on the semiconductor layer;
   a first interconnect provided in a first region on the insulating film;
   a contact plug provided in the first region, extending through the insulating film and electrically connecting the semiconductor layer and the first interconnect;
   a frame-shaped portion provided in a second region different from the first region, the frame-shaped portion extending through the insulating film, the frame-shaped portion having a closed loop that surrounds a first part of the insulating film when viewed from a surface of the insulating film; and
   another insulating film provided in the first region on the insulating film,
   the first interconnect being disposed in the another insulating film,
   the another insulating film being not provided in the second region,
   the frame-shaped portion protruding from the surface of the insulating film, and
   a first step being formed between the frame-shaped portion and the first part of the insulating film.

2. The semiconductor device according to claim 1, having a recess surrounded with the frame-shaped portion.

3. The semiconductor device according to claim 1, wherein the frame-shaped portion has a configuration linked to be continuous in at least one direction along a surface of the semiconductor layer.

4. The semiconductor device according to claim 1, wherein the frame-shaped portion includes a plurality of line-shaped portions.

5. The semiconductor device according to claim 1, wherein
   the insulating film includes a first insulating film and a second insulating film, the first insulating film being provided on the semiconductor layer, the second insulating film being provided between the first insulating film and the first interconnect, and
   the frame-shaped portion includes a first portion and a second portion, the first portion extending through the first insulating film, the second portion extending through the second insulating film and being connected to the first portion.

6. The semiconductor device according to claim 1, wherein the frame-shaped portion is conductive.

7. The semiconductor device according to claim 1, wherein
   the frame-shaped portion includes tungsten, and
   the insulating film is a silicon oxide film.

8. The semiconductor device according to claim 1, wherein
   the frame-shaped portion is surrounded by a second part of the insulating film, and
   a second step is formed between the frame-shaped portion and the second part of the insulating film.

9. An alignment mark including a frame-shaped portion, the alignment mark being used to manufacture a semiconductor device,
   the semiconductor device including a semiconductor layer, an insulating film, another insulating film, a first interconnect, and a contact plug,
   the insulating film being provided on the semiconductor layer,
   the first interconnect being provided on the insulating film, the contact plug extending through the insulating film and electrically connecting the semiconductor layer and the first interconnect,
   the frame-shaped portion having a closed loop that surrounds a first part of the insulating film when viewed from a surface of the insulating film,
   the first interconnect and the contact plug being provided in a first region, the frame-shaped portion being provided in a second region different from the first region,
   the frame-shaped portion protruding from the surface of the insulating film, a first step being formed between the frame-shaped portion and the first part of the insulating film, the another insulating film being provided in the first region on the insulating film, the first interconnect being disposed in the another insulating film, and the another insulating film being not provided in the second region.

* * * * *